US012597465B2

(12) United States Patent
Shiah et al.

(10) Patent No.: US 12,597,465 B2
(45) Date of Patent: Apr. 7, 2026

(54) MEMORY DEVICE

(71) Applicant: Etron Technology, Inc., Hsinchu (TW)

(72) Inventors: Chun Shiah, Hsinchu (TW);
Tzung-Shen Chen, Hsinchu (TW)

(73) Assignee: Etron Technology, Inc., Hsinchu (TW)

( * ) Notice: Subject to any disclaimer, the term of this
patent is extended or adjusted under 35
U.S.C. 154(b) by 114 days.

(21) Appl. No.: 18/585,056

(22) Filed: Feb. 23, 2024

(65) Prior Publication Data

US 2024/0290380 A1    Aug. 29, 2024

Related U.S. Application Data

(60) Provisional application No. 63/447,896, filed on Feb.
24, 2023.

(51) Int. Cl.
*G11C 11/419* (2006.01)
*H10B 10/00* (2023.01)

(52) U.S. Cl.
CPC ............ *G11C 11/419* (2013.01); *H10B 10/12*
(2023.02)

(58) Field of Classification Search
CPC .............................. G11C 11/419; H10B 10/12
See application file for complete search history.

(56) References Cited

U.S. PATENT DOCUMENTS

| | | | | |
|---|---|---|---|---|
| 6,975,532 B1* | 12/2005 | Kosonocky | ........... | G11C 11/406 365/156 |
| 2007/0268747 A1* | 11/2007 | Lin | ..................... | G11C 11/4125 365/185.07 |
| 2008/0002497 A1* | 1/2008 | Barth, Jr. | ................. | G11C 7/12 365/205 |
| 2013/0058155 A1* | 3/2013 | Callen | .................... | H10B 10/12 365/154 |
| 2013/0069167 A1* | 3/2013 | Zhu | ....................... | H10D 84/038 438/303 |
| 2015/0325286 A1* | 11/2015 | Dwivedi | ............... | G11C 11/412 365/154 |

OTHER PUBLICATIONS

"Office Action of Taiwan Counterpart Application", issued on Oct.
29, 2024, p. 1-p. 6.

* cited by examiner

*Primary Examiner* — Min Huang
(74) *Attorney, Agent, or Firm* — JCIPRNET

(57) ABSTRACT
A memory device is provided. The memory device includes:
a latch circuit, having a first inverter and a second inverter
cross-coupled with each other, wherein a first pull up tran-
sistor and a first pull down transistor of the first inverter are
coupled through a first selection transistor, and a second pull
up transistor and a second pull down transistor of the second
inverter are coupled through a second selection transistor; a
first access transistor, coupled to a first storage node of the
latch circuit; and a second access transistor, coupled to a
second storage node of the latch circuit.

18 Claims, 12 Drawing Sheets

10

WL

BL

BLB

MBL

MBLB

TP1

WL

BL

BLB

MBL

MBLB

TP2

WL

BL

BLB

MBL

MBLB

TP1

TP1'

WL

BL

BLB

MBL

MBLB

TP2'

TP2

MEMORY DEVICE

CROSS-REFERENCE TO RELATED APPLICATION

This application claims the priority benefit of U.S. provisional application Ser. No. 63/447,896, filed on Feb. 24, 2023. The entirety of the above-mentioned patent application is hereby incorporated by reference herein and made a part of this specification.

BACKGROUND

Technical Field

Embodiments of the present disclosure are related to a memory device and an operation method thereof, and more particularly, to a static random access memory (SRAM) and an operation thereof.

Description of Related Art

Static random access memory (SRAM) is one of the most comprehensively utilized volatile memories. In general, each SRAM cell has a latch circuit with two cross-coupled inverters, and has access transistors for controlling access to the latch circuit. To ensure that data can be successfully written to storage nodes of the latch circuit, driving ability of the access transistors has to be greater than driving ability of pull up transistors in the latch circuit, hence width/length ratio (indicating a ratio of channel width with respect to channel length herein) of the access transistors is often designed to be greater than a width/length ratio of the pull up transistors. However, increasing the width/length ratio of the access transistors may disadvantageously lower a beta ratio defined as a width/length ratio of pull down transistors in the latch circuit over the width/length ratio of the access transistors, which may compromise read stability. As a solution for improving both of the write capacity and the read stability, width/length ratio of the pull down transistors may be increased, but this may result in area penalty.

SUMMARY

In an aspect of the present disclosure, a memory device is provided. The memory device comprises: a latch circuit, comprising a first inverter and a second inverter cross-coupled with each other, wherein a first pull up transistor and a first pull down transistor of the first inverter are coupled through a first selection transistor, and a second pull up transistor and a second pull down transistor of the second inverter are coupled through a second selection transistor; a first access transistor, coupled to a first storage node of the latch circuit; and a second access transistor, coupled to a second storage node of the latch circuit.

In some embodiments, the first pull up transistor, the first selection transistor, the second pull up transistor and the second selection transistor are implemented by p-type transistors.

In some embodiments, the first storage node is selectively coupled to the first pull down transistor through the first selection transistor, and the second storage node is selectively coupled to the second pull down transistor through the second selection transistor.

In some embodiments, the first pull down transistor, the first selection transistor, the second pull down transistor and the second selection transistor are implemented by n-type transistors.

In some embodiments, one of the first and second selection transistors is configured to be switched off during a write operation.

In some embodiments, the one of the first and second selection transistors is configured to remain off until end of the write operation.

In some embodiments, the one of the first and second selection transistors is configured to be switched on before end of the write operation.

In some embodiments, the one of the first and second selection transistors is configured to be kept off until data stored at one of the first and second storage nodes is flipped during the write operation.

In some embodiments, the first and second selection transistors are configured to be temporarily switched off in a standby mode of the memory device.

In some embodiments, the first access transistor is coupled to a first bit line, the second access transistor is coupled to a second bit line, a gate terminal of the first selection transistor is controlled by a first mask bit line, and a gate terminal of the second selection transistor is controlled by a second mask bit line.

In another aspect of the present disclosure, a memory device is provided. The memory device comprises: a latch circuit, comprising a first inverter with a first pull up transistor, a first pull down transistor and a first selection transistor connected in between, and comprising a second inverter with a second pull up transistor, a second pull down transistor and a second selection transistor connected in between; a first access transistor, coupled to a first common source/drain terminal shared by the first selection transistor and one of the first pull up transistor and the first pull down transistor; and a second access transistor, coupled to a second common source/drain terminal shared by the second selection transistor and one of the second pull up transistor and the second pull down transistor.

In some embodiments, a width/length ratio of the first and second access transistors is less than a width/length ratio of the first and second pull up transistors.

In some embodiments, a beta ratio defined as a ratio of a width/length ratio of the first and second pull down transistors over a width/length ratio of the first and second access transistors is no less than 1.6.

In some embodiments, a width/length ratio of first and second pull down transistors in the latch circuit is less than a width/length ratio of the first and second pull up transistors.

In some embodiments, the first and second selection transistors are implemented by p-type transistors, the first access transistor is coupled to the first common source/drain terminal shared by the first selection transistor and the first pull down transistor, and the second access transistor is coupled to the second common source/drain terminal shared by the second selection transistor and the second pull down transistor.

In some embodiments, the first pull up transistor and the first selection transistor are formed along a first active region, and the second pull up transistor and the second selection transistor are formed along a second active region.

In some embodiments, the first and second selection transistors are implemented by n-type transistors, the first access transistor is coupled to the first common source/drain terminal shared by the first selection transistor and the first pull up transistor, and the second access transistor is coupled to the second common source/drain terminal shared by the second selection transistor and the second pull up transistor.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Embodiments of the present disclosure provide a solution for improving both write capacity and read stability of SRAM, without increasing width/length ratio of pull down transistors in SRAM.

Figure 1:
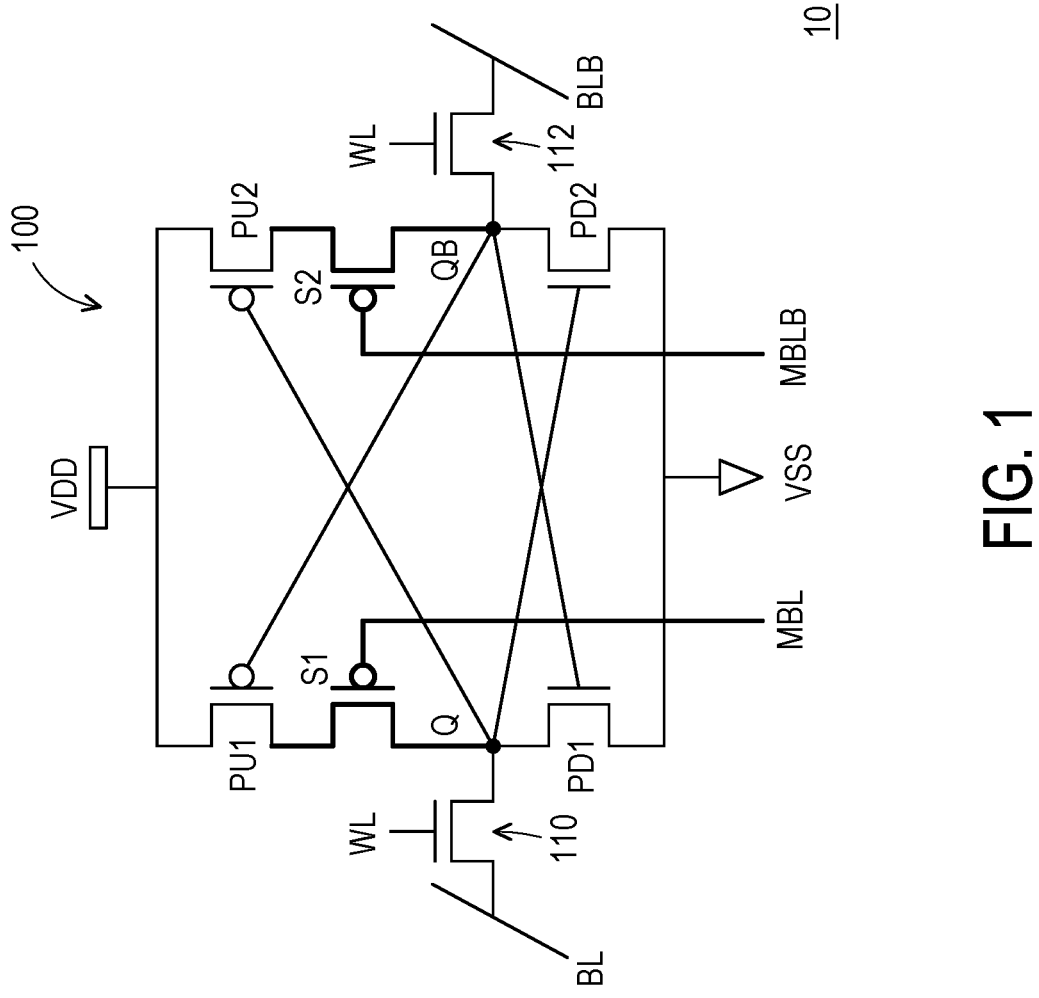
FIG. 1 is a circuit diagram illustrating a memory device, according to some embodiments of the present disclosure.

FIG. 1 is a circuit diagram illustrating a memory device 10, according to some embodiments of the present disclosure.

The memory device 10 is a memory cell in a SRAM. A latch circuit 100 in the memory device 10 is configured to retain data. In addition, the memory device 10 further includes access transistors 110, 112 coupled to storage nodes Q, QB of the latch circuit 100 and configured to control access to the storage nodes Q, QB.

The latch circuit 100 includes two cross-coupled inverters. A first inverter includes a p-type pull up transistor PU1 coupled to a power supply voltage VDD by a source/drain terminal, and includes an n-type pull down transistor PD1 coupled to a reference voltage VSS (e.g., a ground voltage) by a source/drain terminal. The other source/drain terminal of the pull up transistor PU1 is coupled to the other source/drain terminal of the pull down transistor PD1, to form an input/output of the first inverter (e.g., an input terminal of the first inverter) and the storage node Q of the latch circuit 100. In addition, gate terminals of the pull up transistor PU1 and the pull down transistor PD1 are connected to form the other input/output terminal of the first inverter (e.g., an output terminal of the first inverter) and the storage node QB of the latch circuit 100.

Similarly, a second inverter includes a p-type pull up transistor PU2 coupled to the power supply voltage VDD by a source/drain terminal, and includes an n-type pull down transistor PD2 coupled to the reference voltage VSS by a source/drain terminal. The other source/drain terminal of the pull up transistor PU2 and the other source/drain terminal of the pull down transistor PD2 are connected to the storage node QB of the latch circuit 100, which is also functioned as an input/output of second the inverter (e.g., an input terminal of the second inverter). In addition, the gate terminals of the pull up transistor PU2 and the pull down transistor PD2 are connected to the storage node Q of the latch circuit 100, which is also functioned as the other input/output terminal of second the inverter (e.g., an output terminal of the second inverter).

In this way, an input terminal of the first inverter is coupled to an output terminal of the second inverter, and an output terminal of the first inverter is coupled to an input terminal of the second inverter. Accordingly, when a first data is written to one of the storage nodes Q, QB as an input terminal of one of the inverters, an inverted (i.e., complementary) second data is resulted at the other one of the storage nodes Q, QB as an output terminal of this inverter, and the other inverter in turn keeps the first data at output terminal inverted to the second data at input terminal. Therefore, complementary data can be kept at the storage nodes Q, QB of the latch circuit 100.

The access transistor 110 is functioned as a switch controlling connection between the storage node Q and a bit line BL. Specifically, the access transistor 110 may be implemented by an n-type transistor, and the storage node Q is coupled to a source/drain terminal of the access transistor 110, while the bit line BL is coupled to the other source/drain terminal of the access transistor 110. When a word line WL coupled to a gate terminal of the access transistor 110 is asserted, the connection between the bit line BL and the storage node Q can be established, and data can be written to or read from the storage node Q. On the other hand, when the word line WL is not asserted, the storage node Q is decoupled from the bit line BL.

Similarly, the access transistor 112 is functioned as a switch controlling connection between the storage node QB and a bit line BLB, and may be implemented by an n-type transistor as well. The storage node QB is coupled to a source/drain terminal of the access transistor 112, while the bit line BLB is coupled to the other source/drain terminal of the access transistor 112. When the word line WL also coupled to a gate terminal of the access transistor 112 is asserted, the connection between the bit line BLB and the storage node QB can be established, and data can be written to or read from the storage node QB. Otherwise, the storage node QB is decoupled from the bit line BLB.

To ensure that data can be successfully written to the storage nodes Q, QB, current driven to the storage nodes Q, QB by the access transistors 110, 112 cannot be drained away by the power supply voltage VDD or the reference voltage VSS complementary to the written data. As an alternative, the access transistors 110, 112 can be designed with greater width/length ratio, to have enhanced driving ability. However, this would result in read disturbance, which indicates that the data stored at the storage nodes Q, QB are flipped during a read operation. According to embodiments of the present disclosure, successful write and read can be both ensured by temporally decoupling one of the storage nodes Q, QB from the power supply voltage VDD or the reference voltage VSS during write operations. As will be described in further details, such switching is implemented by selection transistors coupled to the storage nodes Q, QB.

In some embodiments, instead of being directly coupled to the storage node Q, the pull up transistor PU1 configured to pull up the storage node Q to the power supply voltage VDD is selectively coupled to the storage node Q through a selection transistor S1 (e.g., a p-type transistor). That is, the pull up transistor PU1 is coupled to the storage node Q when the selection transistor S1 is turned on, and is disconnected from the storage node Q when the selection transistor S1 is switched off. More specifically, a source/drain terminal of the selection transistor S1 is coupled to the storage node Q, and the other source/drain terminal of the selection transistor S1 is coupled to one of the source/drain terminals of the pull up transistor PU1, while the other source/drain terminal of the pull up transistor PU1 is coupled to the power supply voltage VDD. When a mask bit line MBL coupled to a gate terminal of the selection transistor S1 is asserted, a conduction path between the source/drain terminals of the selection transistor S1 can be established, hence the pull up transistor PU1 can couple the storage node Q to the power supply voltage VDD. On the other hand, when the mask bit line MBL is not asserted, the conduction path is cut off or absent, and the storage node Q is decoupled from the power supply voltage VDD.

Similarly, the pull up transistor PU2 configured to pull up the storage node QB to the power supply voltage VDD is selectively coupled to the storage node QB through a selection transistor S2 (e.g., a p-type transistor). That is, the pull up transistor PU2 is coupled to the storage node QB when the selection transistor S2 is turned on, and is disconnected from the storage node QB when the selection transistor S2 is switched off. More specifically, a source/drain terminal of the selection transistor S2 is coupled to the storage node QB, and the other source/drain terminal of the selection transistor S2 is coupled to one of the source/drain terminals of the pull up transistor PU2, while the other source/drain terminal of the pull up transistor PU2 is coupled to the power supply voltage VDD. When a mask bit line MBLB coupled to a gate terminal of the selection transistor S2 is asserted, a conduction path between the source/drain terminals of the selection transistor S2 can be established, hence the pull up transistor PU2 can couple the storage node QB to the power supply voltage VDD. On the other hand, when the mask bit line MBLB is not asserted, the conduction path is cut off or absent, and the storage node QB is decoupled from the power supply voltage.

During each write operation, one of the selection transistors S1, S2 is turned on, to ensure that a logic low data "0" can be successfully written to the storage node Q or the storage node QB.

Figure 2A:
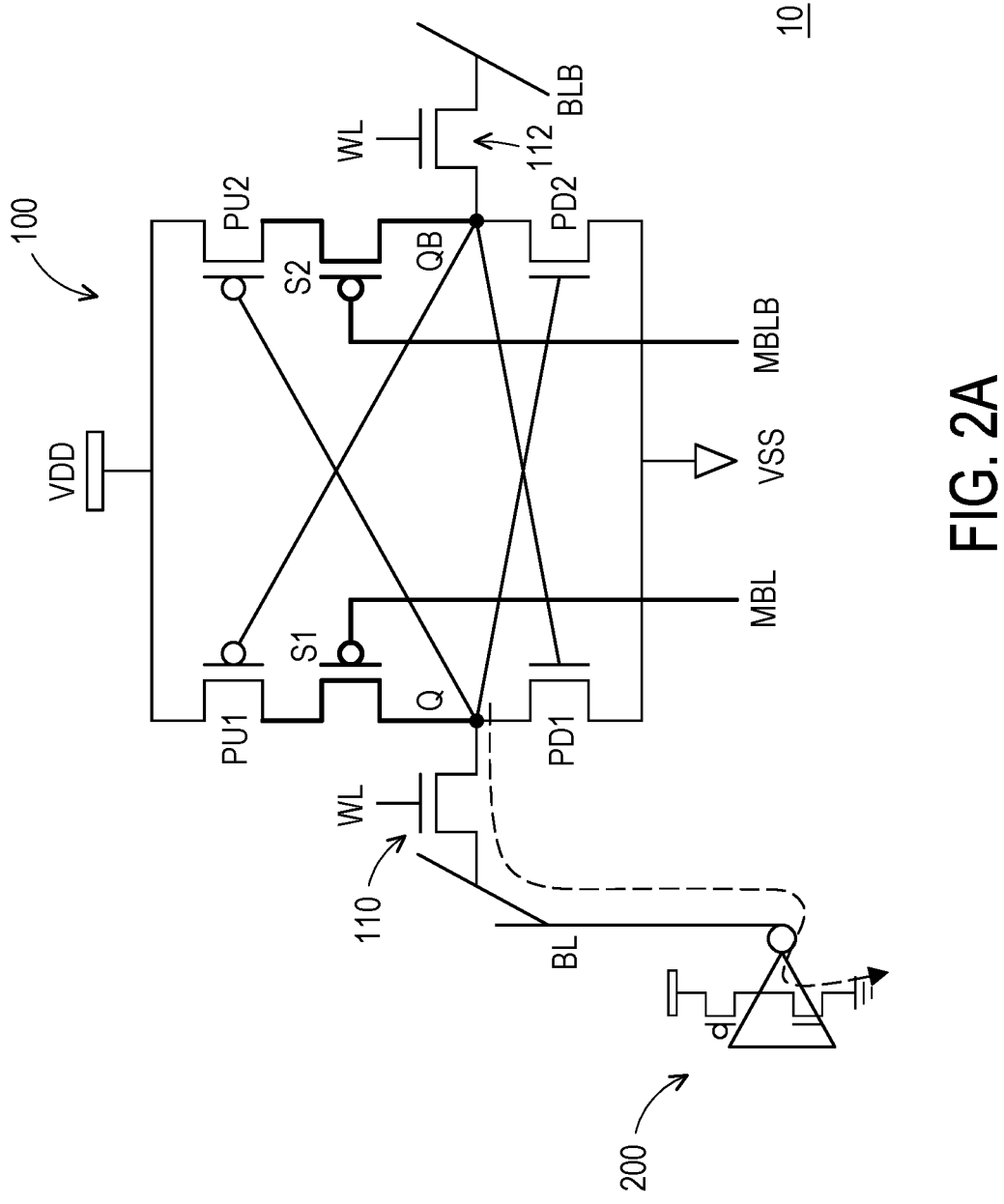
FIG. 2A is a circuit diagram illustrating the memory device during a first write operation, according to some embodiments of the present disclosure.
Figure 2B:
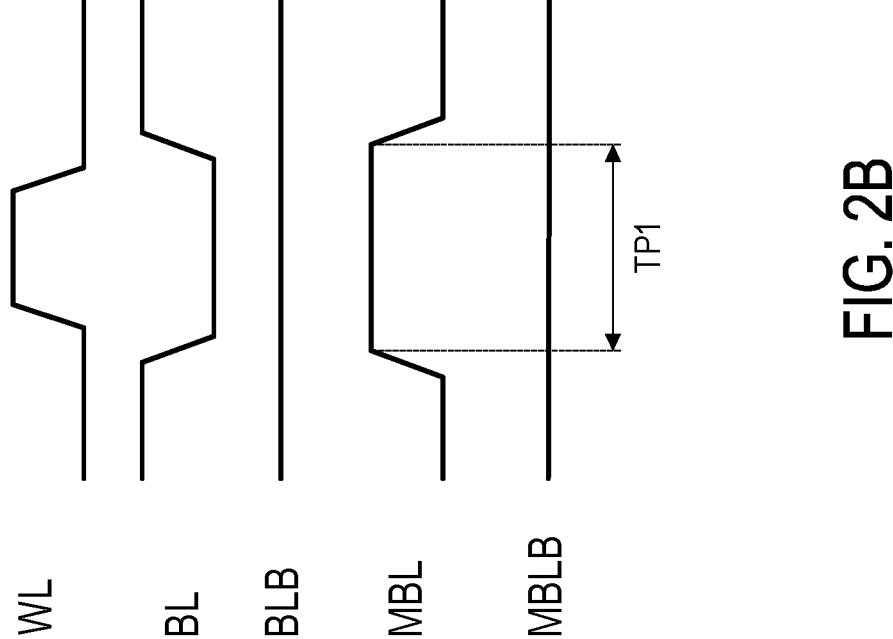
FIG. 2B is a timing diagram illustrating waveform of the first write operation shown in FIG. 2A.

FIG. 2A is a circuit diagram illustrating the memory device 10 during a write operation, according to some embodiments of the present disclosure. FIG. 2B is a timing diagram illustrating waveform of the write operation shown in FIG. 2A.

In this write operation, a logic low data "0" is instructed to be written to the storage node Q keeping a logic high data "1". As keeping the logic high data "1", the storage node Q is coupled to the power supply voltage VDD through the selection transistor S1 and the pull up transistor PU1. That is, initially, the mask bit line MBL controlling switch of the selection transistor S1 is asserted. In those embodiments where the selection transistor S1 is a p-type transistor, the mask bit line MBL is kept at a logic low voltage (e.g., the reference voltage VSS) in an initial state of the write operation.

As the write operation for writing the logic low data "0" to the storage node Q begins, the bit line BL is pulled down to the logic low voltage indicating the logic low data "0" by a write driver 200, and the word line WL is asserted (i.e., pulled up). Accordingly, the storage node Q is coupled to the bit line BL through the access transistor 110, and can be pulled down. In an early stage of the write operation, the pull up transistor PU1 may still be conducting (as the gate terminal of the p-type pull up transistor PU1 is coupled to the storage node QB storing the logic low data "0"). To prevent the pull up transistor PU1 from pulling the storage node Q against the access transistor 110, the pull up transistor PU1 is forced to be decoupled from the storage node Q by turning off the selection transistor S1 during the write operation. When the selection transistor S1 is implemented by a p-type transistor, the mask bit line MBL is pulled up during the write operation, for switching off the selection transistor S1. As shown in FIG. 2B, according to some embodiments, the mask bit line MBL is pulled (e.g., pulled up) in an entire time period TP1 of the write operation, such that a conduction channel is cut off during the entire time period TP1 of the write operation. Since the pull up transistor PU1 is decoupled from the storage node Q, the access transistor 110 can perform the writing without competing with the pull up transistor PU1. In other words, the access transistor 110 is not required to have a very strong driving ability for ensuring successful write. In this way, as will be further described, the pull down transistors PD1, PD2 are not required to have even stronger driving ability for ensuring successful read, thus both write and read can be improved without area penalty.

Meanwhile, the bit line BLB is coupled to a logic high voltage (e.g., the power supply voltage VDD) indicating a logic high data "1". As the access transistor 112 is turned on by the asserted word line WL, the storage node QB can be pulled up through the access transistor 112. Also, as the storage node Q is pulled down to the logic low voltage indicating the logic low data "0", the pull up transistor PU2 with gate terminal coupled to the storage node Q is turned on, while the pull down transistor PD2 with gate terminal coupled to the storage node Q is switched off. By keeping the mask bit line MBLB asserted, the selection transistor S2 is turned on as well. Accordingly, pulling up the storage node QB can also be performed through the selection transistor S2 and the pull up transistor PU2. In those embodiments where the selection transistor S2 is a p-type transistor, the mask bit line MBLB is remained at a logic low voltage during the write operation, for ensuring that the selection transistor S2 is kept on.

As the storage node Q is pulled down and the storage node QB is pulled up, the write operation is completed. According to some embodiments, after the write operation, the selection transistor S1 is switched back on, and the selection transistor S2 is remained on. In this way, the data stored at the storage nodes Q, QB can be kept as a result of the cross coupling of the inverters in the latch circuit 100. In those embodiments where the selection transistors S1, S2 are p-type transistors, the mask bit line MBL is pulled down after the time period TP1, whereas the mask bit line MBLB is remained at the logic low voltage through the write operation.

A similar write scheme may be used for writing a logic low data "0" to the storage node QB, which may be the same as writing a logic high data "1" to the storage node Q.

Figure 2C:
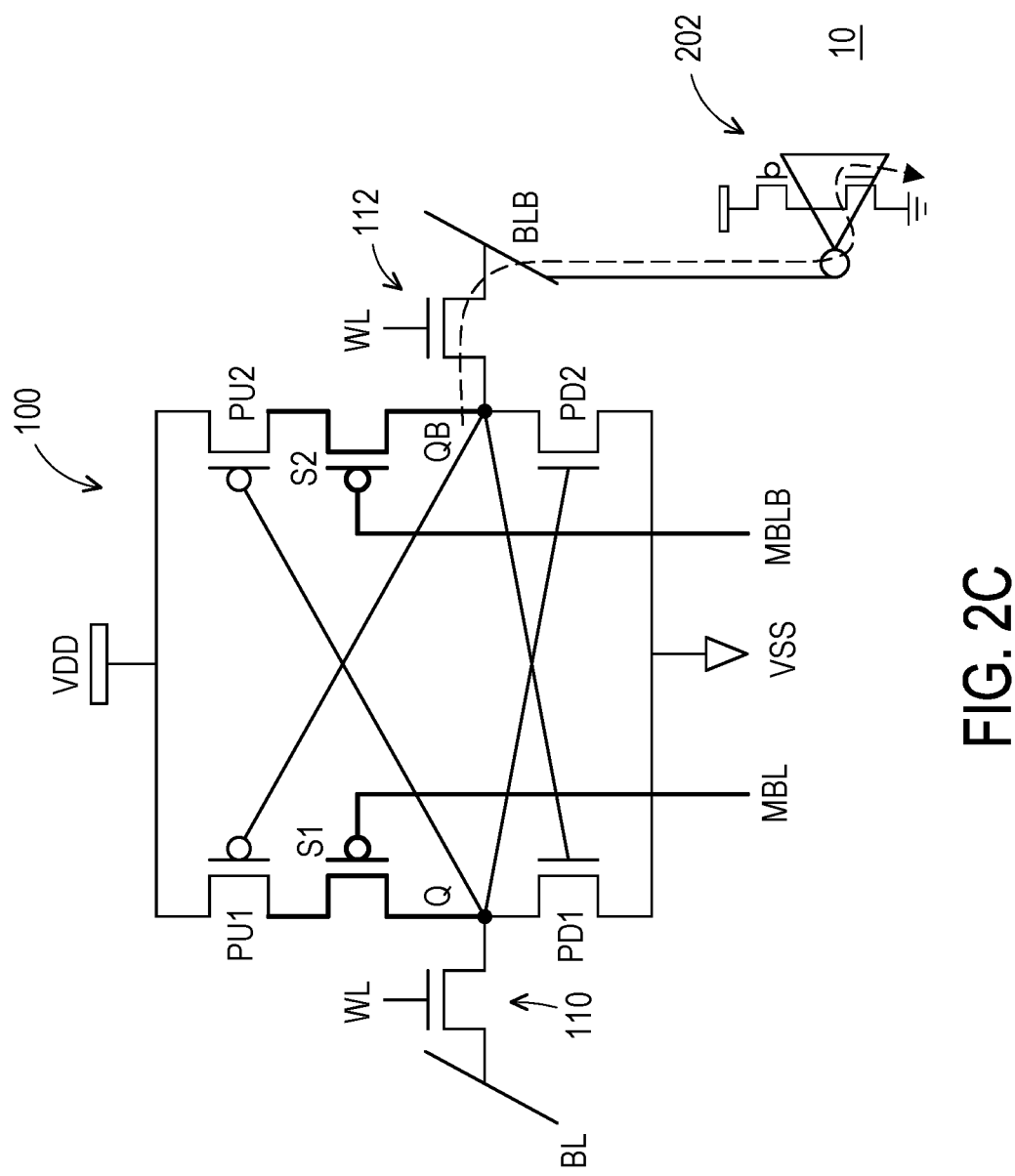
FIG. 2C is a circuit diagram illustrating the memory device during a second write operation, according to some embodiments of the present disclosure.
Figure 2D:
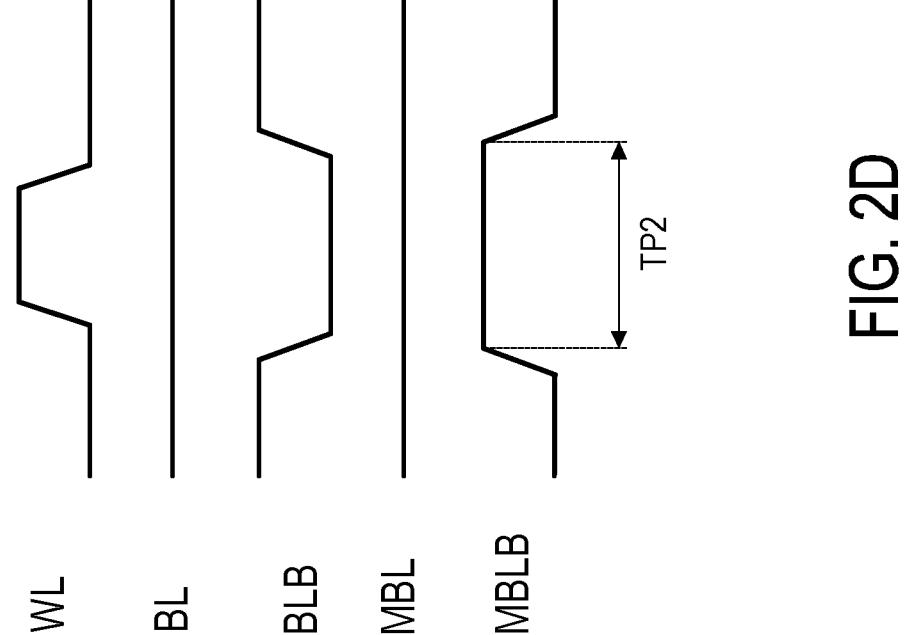
FIG. 2D is a timing diagram illustrating waveform of the second write operation shown in FIG. 2C.

FIG. 2C is a circuit diagram illustrating the memory device 10 during a write operation for writing a logic low data "0" to the storage node QB, according to some embodiments of the present disclosure. FIG. 2D is a timing diagram illustrating waveform of the write operation shown in FIG. 2C.

Initially, the storage node QB is coupled to the power supply voltage VDD through the selection transistor S2 and the pull up transistor PU2, for keeping a logic high data "1". That is, the mask bit line MBLB controlling switch of the selection transistor S2 is initially asserted. In those embodiments where the selection transistor S2 is a p-type transistor, the mask bit line MBLB is kept at a logic low voltage (e.g., the reference voltage VSS) in an initial state of the write operation.

As the write operation for writing the logic low data "0" to the storage node QB begins, the bit line BLB is pulled down to the logic low voltage indicating the logic low data "0" by a write driver 202, and the word line WL is asserted (i.e., pulled up). Accordingly, the storage node QB is coupled to the bit line BLB through the access transistor 112, and can be pulled down. In an early stage of the write operation, the pull up transistor PU2 may still be conducting (as the gate terminal of the p-type pull up transistor PU2 is coupled to the storage node Q storing the logic low data "0"). To prevent the pull up transistor PU2 from pulling the storage node QB against the access transistor 112, the pull up transistor PU2 is forced to be decoupled from the storage node QB by turning off the selection transistor S2 during the write operation. When the selection transistor S2 is implemented by a p-type transistor, the mask bit line MBLB is pulled up during the write operation, for switching off the selection transistor S2. As shown in FIG. 2D, according to some embodiments, the mask bit line MBLB is pulled (e.g., pulled up) in an entire time period TP2 of the write operation, such that a conduction channel is cut off during the entire time period TP2 of the write operation. Since the pull up transistor PU2 is decoupled from the storage node QB, the access transistor 112 can perform the writing without competing with the pull up transistor PU2. In other words, the access transistor 112 is not required to have a very strong driving ability for ensuring successful write. In this way, as will be further described, the pull down transistors PD1, PD2 are not required to have even stronger driving ability for ensuring successful read, thus both write and read can be improved without area penalty.

Meanwhile, the bit line BL is coupled to a logic high voltage (e.g., the power supply voltage VDD) indicating a logic high data "1". As the access transistor 110 is turned on by the asserted word line WL, the storage node Q can be pulled up through the access transistor 110. Also, as the storage node QB is pulled down to the logic low voltage indicating the logic low data "0", the pull up transistor PU1 with gate terminal coupled to the storage node QB is turned on, while the pull down transistor PD1 with gate terminal coupled to the storage node QB is switched off. By keeping the mask bit line MBL asserted, the selection transistor S1 is turned on as well. Accordingly, pulling up the storage node Q can also be performed through the selection transistor S1 and the pull up transistor PU1. In those embodiments where the selection transistor S1 is a p-type transistor, the mask bit line MBL is remained at a logic low voltage during the write operation, for ensuring that the selection transistor S1 is kept on.

As the storage node QB is pulled down and the storage node Q is pulled up, the write operation is completed. According to some embodiments, after the write operation, the selection transistor S2 is switched back on, and the selection transistor S1 is remained on. In this way, the data stored at the storage nodes Q, QB can be kept as a result of the cross coupling of the inverters in the latch circuit 100. In those embodiments where the selection transistors S1, S2 are p-type transistors, the mask bit line MBLB is pulled down after the time period TP2, whereas the mask bit line MBL is remained at the logic low voltage through the write operation.

As described, successful write can be ensured by decoupling the storage node Q or the storage node QB from the corresponding one of the pull up transistors PU1, PU2 during each write operation. Since the access transistors 110, 112 are no longer required to have very strong driving ability, width/length ratio of the access transistors 110, 112 is allowed to be reduced, such that read stability can be improved without increasing driving ability of the pull down transistors PD1, PD2 (i.e., width/length ratio of the pull down transistors PD1, PD2).

Referring to FIG. 1 again, during a read operation, both of the bit lines BL, BLB are pre-charged. By asserting the word line WL (i.e., pulling up the word line WL), the pre-charged bit line BL is coupled to the storage node Q, and the pre-charged bit line BLB is coupled to the storage node QB. As the storage nodes Q, QB store complementary data, one of the bit lines BL, BLB is discharged by one of the storage nodes Q, QB keeping the logic low data "0". By sensing a differential voltage developed between the bit lines BL, BLB using a sense amplifier (not shown), data stored at the storage nodes Q, QB can be identified.

However, the read operation can be successful when one of the pull down transistors PD1, PD2 coupled to the storage node keeping the logic low data "0" (e.g., the storage node QB) out drive the corresponding access transistor (e.g., the access transistor 112). Otherwise, the storage node keeping the logic low data "0" (e.g., the storage node QB) would be flipped over by the corresponding one of the pre-charged bit lines BL, BLB, and the other storage node (e.g., the storage node Q) would be flipped accordingly. Therefore, a key to ensure successful read lies in that a driving ability of the pull down transistors PD1, PD2 should be greater than a driving ability of the access transistors 110, 112. In other words, promising read stability can be ensured by increasing a "beta ratio" defined as a width/length ratio of the pull down transistors PD1, PD2 over a width/length ratio of the access transistors 110, 112.

As described, by controlling the selection transistors S1, S2 to decouple the storage nodes Q, QB from the pull up transistors PU1, PU2 during write operations, the access transistors 110, 112 can successfully perform writing without competing with the pull up transistors PU1, PU2, thus are not required to have very strong driving ability. In this way, the pull down transistors PD1, PD2 can easily out drive the access transistors 110, 112 during reading, hence reading stability can be improved as well. In general, driving ability of a transistor is in positive relationship with width/length ratio of the transistor. As the access transistors 110, 112 no longer require very strong driving ability, the width/length ratio of the access transistors 110, 112 can be reduced. Accordingly, the width/length ratio of the pull down transistors PD1, PD2 can be reduced while still capable of out driving the access transistors 110, 112 during reading. In this way, an ideal beta ratio can be obtained without area penalty. Alternatively, the width/length of the pull down transistors PD1, PD2 may remain, and even greater beta ratio can be resulted to ensure even better read stability. In either case, the access transistors 110, 112 can be designed with a smaller width/length ratio. In some embodiments, the beta ratio is no less than 1.6.

At a certain technology node, length (i.e., channel length) of the transistors included in the memory device 10 is about 35 nm, and width (i.e., channel width) of the pull up transistors PU1, PU2 is around 40 nm. Without introducing the selection transistors S1, S2, the access transistors 110, 112 are designed with a greater width of around 65 nm to out drive the pull up transistors PU1, PU2 during writing, and the pull down transistors PD1, PD2 are designed with an even greater width of around 95 nm to ensure stable read. According to some embodiments of the present disclosure, by introducing the selection transistors S1, S2, the width of the access transistors 110, 112 can be reduced to about 20 nm, without compromising writing. In these embodiments, the width/length ratio of the pull down transistors PD1, PD2 becomes almost 5 times of width/length ratio of the access transistors 110, 112 (i.e., beta ratio increased to about 5), and more promising read stability can be resulted. In alternative embodiments, by introducing the selection transistors S1, S2, the width of the access transistors 110, 112 can be reduced to about 15~16 nm, and the beta ratio remains, while the width of the pull down transistors PD1, PD2 may be reduced to about 24 nm. In these alternative embodiments, the beta ratio is about 1.6.

Figure 3:
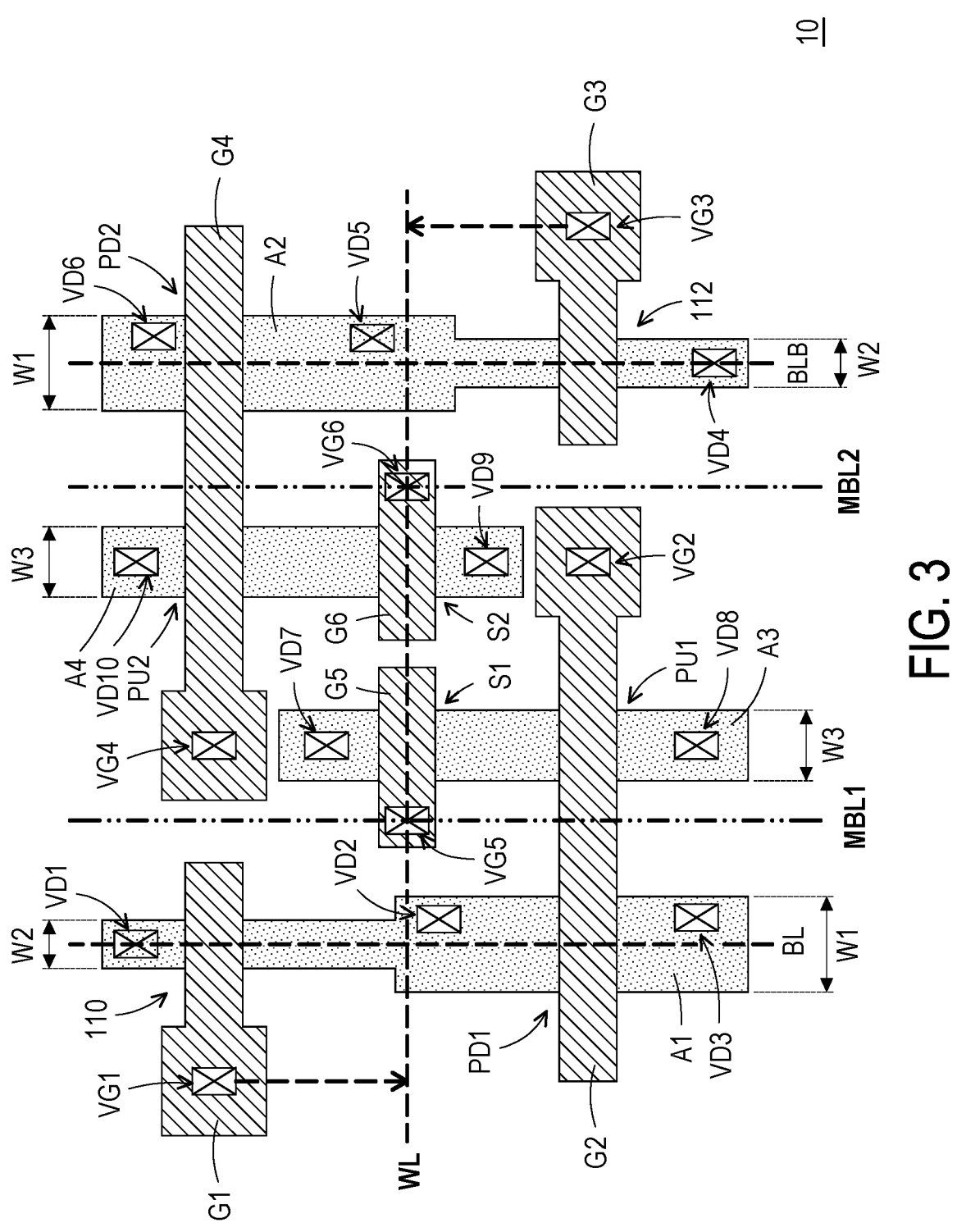
FIG. 3 is a schematic plan view illustrating a layout of the memory device, according to some embodiments of the present disclosure.

FIG. 3 is a schematic plan view illustrating a layout of the memory device 10, according to some embodiments of the present disclosure.

The access transistor 110 and the pull down transistor PD1 coupled to the storage node Q share an active region A1, and are controlled by gate structures G1, G2, respectively. Similarly, the access transistor 112 and the pull down transistor PD2 coupled to the storage node QB share an active region A2, and are controlled by gate structures G3, G4, respectively. The active regions A1, A2 are defined at a surface of a semiconductor substrate by an isolation structure. As the access transistors 110, 112 and the pull down transistors PD1, PD2 are implemented by n-type transistors, the active regions A1, A2 may be formed with p-type, or may be intrinsic.

The gate structures G1-G4 cross over and cover the active regions A1, A2. A gate terminal of the access transistor 110 provided by the gate structure G1 is coupled to the word line WL through a conductive via VG1. In addition, a gate terminal of the access transistor 112 provided by the gate structure G3 is coupled to the word line WL through a conductive via VG3. As will be described in greater details, the gate structure G2 providing a gate terminal for the pull down transistor PD1 further extends across another active region A3, and is routed by a conductive via VG2. Likewise, the gate structure G4 providing a gate terminal for the pull down transistor PD2 further extends across another active region A4, and is routed by a conductive via VG4.

Although not shown, sections of the active regions A1, A2 at opposite sides of each of the intersected gate structures G1-G4 may be replaced by source/drain structures (e.g., epitaxial structures) functioned as source/drain terminals of the access transistors 110, 112 and the pull down transistors PD1, PD2. One of the source/drain terminals of the access transistor 110 is coupled to the bit line BL through a conductive via VD1, while the other source/drain terminal of the access transistor 110 is shared with the pull down transistor PD1, and routed through a conductive via VD2. In addition, a conductive via VD3 may couple the other source/ drain terminal of the pull down transistor PD1 to a power rail (not shown) conducting the reference voltage VSS. On the other hand, one of the source/drain terminals of the access transistor 112 is coupled to the bit line BLB through a conductive via VD4, while the other source/drain terminal of the access transistor 112 is shared with the pull down transistor PD2, and routed through a conductive via VD5. In addition, a conductive via VD6 may couple the other source/drain terminal of the pull down transistor PD2 to a power rail (not shown) conducting the reference voltage VSS.

As described, the gate structure G2 providing a gate terminal of the pull down transistor PD1 may further extend across the active region A3. The active region A3 is shared by the pull up transistor PU1 and the selection transistor S1. The pull up transistor PU1 is defined at an intersection of the active region A3 and the gate structure G2, while the selection transistor S1 is defined at an intersection of the active region A3 and an additional gate structure G5. In those embodiments where the pull up transistor PU1 and the selection transistor S1 are implemented by p-type transistors, the active region A3 defined at the surface of the semiconductor substrate may be formed with n-type, or may be intrinsic. The gate structures G2, G5 extend across and cover the active region A3. The gate structure G2 as a common gate terminal of the pull down transistor PD1 and the pull up transistor PU1 is routed through the conductive via VG2. In addition, the gate structure G5 as the gate terminal of the selection transistor S1 is coupled to the mask bit line MBL through a conductive via VG5.

Although not shown, sections of the active region A3 at opposite sides of each of the intersected gate structures G2, G5 may be replaced by source/drain structures (e.g., epitaxial structures) functioned as source/drain terminals of the pull up transistor PU1 and the selection transistor S1. One of the source/drain terminals of the selection transistor S1 is coupled to the common source/drain terminal shared by the access transistor 110 and the pull down transistor PD1 (where the conductive via VD2 stands) through a conductive via VD7. The other source/drain terminal of the selection transistor S1 is shared with the pull up transistor PU1, and the other source/drain terminal of the pull up transistor PU1 is coupled to a power rail (not shown) conducting the power supply voltage VDD through a conductive via VD8.

On the other hand, the gate structure G4 providing a gate terminal of the pull down transistor PD2 may further extend across the active region A4. The active region A4 is shared by the pull up transistor PU2 and the selection transistor S2. The pull up transistor PU2 is defined at an intersection of the active region A4 and the gate structure G4, while the selection transistor S2 is defined at an intersection of the active region A4 and an additional gate structure G6. In those embodiments where the pull up transistor PU2 and the selection transistor S2 are implemented by p-type transistors, the active region A4 defined at the surface of the semiconductor substrate may be formed with n-type, or may be intrinsic. The gate structures G4, G6 extend across and cover the active region A4. As a common gate terminal of the pull down transistor PD2 and the pull up transistor PU2, the gate structure G4 is routed through the conductive via VG4. In addition, as the gate terminal of the selection transistor S2, the gate structure G6 is coupled to the mask bit line MBLB through a conductive via VG6.

Although not shown, sections of the active region A4 at opposite sides of each of the intersected gate structures G4, G6 may be replaced by source/drain structures (e.g., epitaxial structures) functioned as source/drain terminals of the pull up transistor PU2 and the selection transistor S2. One of the source/drain terminals of the selection transistor S2 is coupled to the common source/drain terminal shared by the access transistor 112 and the pull down transistor PD2 (where the conductive via VD5 stands) through a conductive via VD9. The other source/drain terminal of the selection transistor S2 is shared with the pull up transistor PU2, and the other source/drain terminal of the pull up transistor PU2 is coupled to a power rail (not shown) conducting the power supply voltage VDD through a conductive via VD10.

As described, the driving ability of the pull down transistors PD1, PD2 has to be stronger than the driving ability of the access transistors 110, 112 for ensuring read stability. In other words, the width/length ratio of the pull down transistors PD1, PD2 is greater than the width/length ratio of the access transistors 110, 112.

At a certain technology node, the transistors in the memory device 10 may have identical length (i.e., channel length), while having different widths (i.e., channel widths). According to some embodiments, the active region A1 has a thick section providing channel(s) for the pull down transistor PD1, and has a narrow section providing channel(s) for the access transistor 110. Similarly, the active region A2 has a thick section providing channel(s) for the pull down transistor PD2, and has a narrow section providing channel(s) for the access transistor 112. A width W1 of the thick section of the active region A1 is greater than a width W2 of the narrow section of the active region A1, such that the width and width/length ratio of the pull down transistor PD1 are greater than the width and width/length ratio of the access transistor 110, respectively. Also, the thick section of the active region A2 may be designed with the width W1 while the narrow section of the active region A2 is designed with the width W2, such that the width and width/length ratio of the pull down transistor PD2 are greater than the width and width/length ratio of the access transistor 112. In this way, the driving ability of the access transistors 110, 112 is stronger than the driving ability of the pull down transistors PD1, PD2, for ensuring read stability.

On the other hand, by disposing the selection transistors S1, S2, successful write can be ensured even when the driving ability of the access transistors 110, 112 is weaker than the driving ability of the pull up transistors PU1, PU2. That is, the width/length ratio of the access transistors 110, 112 does not have to be greater than the width/length ratio of the pull up transistors PU1, PU2. Since the transistors in the memory device 10 may have substantially identical length (i.e., channel length), relationship between the width/length ratio of the access transistors 110, 112 and the width/length ratio of the pull up transistors PU1, PU2 can be determined by setting the widths of the access transistors 110, 112 and the pull up transistors PU1, PU2.

As shown in FIG. 3, the active region A3 providing channels for the pull up transistor PU1 and the selection transistor S1 may have a fixed width W3 along its length direction. Similarly, the active region A4 providing channels for the pull up transistor PU2 and the selection transistor S2 may also have the width W3 along its length direction. According to the embodiments where the pull up transistors PU1, PU2 are greater than the access transistors 110, 112 in terms of driving ability and width/length ratio, the width W3 may be greater than the width W2. In addition, the width W3 may be greater than, equal to or shorter than the width W1. As an example, the width W1 is about 95 nm, whereas the width W2 is about 20 nm, and the width W3 is about 40 nm. As another example, the width W1 is about 24 nm, whereas the width W2 is about 15 nm, and the width W3 is about 40 nm.

In addition to ensure both write and read without causing area penalty, the selection transistors S1, S2 can be operated to reduce power consumption during standby mode of the memory device 10. Referring to FIG. 1 again, during a standby node, the word line WL is released (i.e., pulled down), such that the storage nodes Q, QB are decoupled from the bit lines BL, BLB. Meanwhile, the mask bit line MBL, MBLB are both pulled (e.g., pulled up) to switch off the selection transistors S1, S2. Accordingly, the storage nodes Q, QB are decoupled from the pull up transistors PU1, PU2. In this way, one of the storage nodes Q, QB that stores the logic high data "1" may be floated, and the logic high data "1" can be at least temporarily stored. On the other hand, the other one of the storage nodes Q, QB that stores the logic low data "0" may at least temporarily be coupled to the reference voltage VSS through the corresponding one of the pull down transistors PD1, PD2. Even when the one of the storage nodes Q, QB stores the logic low data "0" is decoupled from the reference voltage VSS, the logic low data "0" can be at least temporarily kept.

As the complementary data can be at least temporarily kept without being powered by the power supply voltage VDD, the power supply voltage VDD can be removed during the standby mode. Therefore, power consumption during the standby mode can be significantly reduced. To recover the data, a quick refresh by asserting (e.g., pulling down) the mask bit lines MBL, MBLB may be performed before accessing the storage nodes Q, QB.

Figure 4:
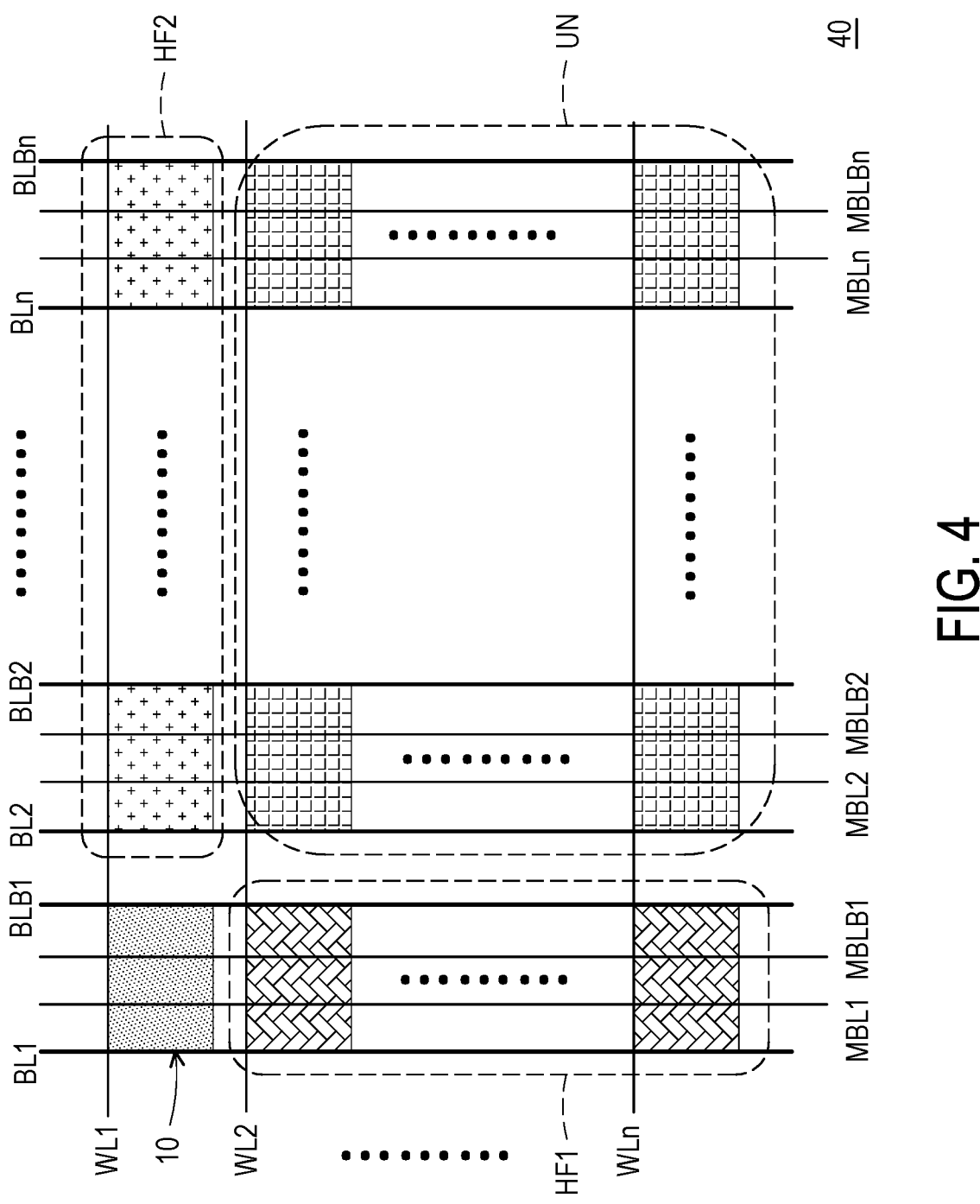
FIG. 4 is a schematic diagram illustrating a memory array including a plurality of the memory devices, according to some embodiments of the present disclosure.

FIG. 4 is a schematic diagram illustrating a memory array 40 including a plurality of the memory devices 10 described above, according to some embodiments of the present disclosure. The memory devices 10 are arranged along rows and columns in the memory array 40. The memory devices 10 in the same row may share the same word line WL (i.e., one of word lines WL1, WL2, . . . and WLn). In addition, the memory devices 10 in the same column may share the same pair of bit lines BL, BLB (i.e., bit lines BL1, BLB1, bit lines BL2, BLB2, . . . or bit lines BLn, BLBn) and the same pair of mask bit lines MBL, MBLB (i.e., mask bit lines MBL1, MBLB1, mask bit lines MBL2, MBLB2, . . . or mask bit lines MBLn, MBLBn).

During a write or read operation, one of the memory devices 10 is selected. Other memory devices 10 in the same column as the selected memory device 10 share the same set of bit lines BL, BLB and mask bit lines MBL, MBLB with the selected memory device 10, thus are half-selected. Similarly, other memory devices 10 in the same row as the selected memory device 10 share the same word line WL with the selected memory device 10, and are half-selected as well. On the other hand, the memory devices 10 do not share with any of the word lines, bit lines BL, BLB and mask bit lines MBL, MBLB with the selected memory device 10, hence are considered as unselected.

As an example, during a read or write operation, the memory device 10 coupled to the word line WL1, the bit lines BL1, BLB1 and the mask bit lines MBL1, MBLB1 is selected. Meanwhile, a group HF1 of the memory devices 10 in the same column with the selected memory device 10 are half-selected. Also, a group HF2 of the memory devices 10 in the same row with the selected memory device 10 are half-selected as well. On the other hand, a group UN of the memory device 10 arranged in other rows and columns are unselected.

The memory devices 10 in the unselected group UN would not be affected by the read or write performed on the selected memory cell 10, as not being coupled to any of the word line WL1, bit lines BL1, BLB1, mask bit lines MBL1, MBLB1 connected to the selected memory device 10. The word lines WL2 to WLn connected to the memory devices 10 in the unselected group UN may not be asserted during the read/write operation. In addition, the bit lines BL2, BLB2, . . . , BLn and BLBn connected to the memory devices 10 in the unselected group UN may be coupled to the power supply voltage VDD or floated during the read/write operation. Further, the mask bit lines MBL2, MBLB2, . . . , MBLn and MBLBn connected to the memory devices 10 in the unselected group may be asserted (e.g., kept at the reference voltage VSS) during the read/write operation.

The memory devices 10 in the half-selected group HF2 may share the word line WL1 with the selected memory device 10. That is, the access transistors 110, 112 of the memory devices 10 in the half-selected group HF2 would be turned on during the read/write operation. Nevertheless, to prevent from flipping over the data stored in these memory devices 10, the bit lines BL2, BLB2, . . . , BLn and BLBn connected to these memory devices 10 may be all pulled up to the power supply voltage VDD or all floated, and the mask bit lines MBL2, MBLB2, . . . , MBLn and MBLBn connected to these memory devices 10 may be asserted (e.g., kept at the reference voltage VSS).

In addition, the memory devices 10 in the half-selected group HF1 may share the bit lines BL1, BLB1 and the mask bit lines MBL1, MBLB1 with the selected memory device 10, but are connected to un-asserted word lines WL2 to WLn. As the access transistors 110, 112 in these memory devices 10 would not be turned on, the storage nodes Q, QB in these memory devices 10 would not be coupled to the shared bit lines BL1, BLB1. When the selected memory device 10 is subjected to writing, one of the mask bit lines MBL1, MBLB1 is pulled (e.g., pulled up) to switch off the corresponding selection transistor S1/S2 in the selected memory device 10. Accordingly, one of the storage nodes Q, QB of each memory device 10 in the half-selected group HF1 would be floated.

According to some embodiments, the time in which the mask bit line MBL/MBLB is pulled to switch off the corresponding selection transistor S1/S2 in each write operation is shortened, to reduce floating time of the storage node Q/QB of each memory device 10 sharing the same pair of mask bit lines MBL, MBLB with the selected memory device 10.

Figure 5A:
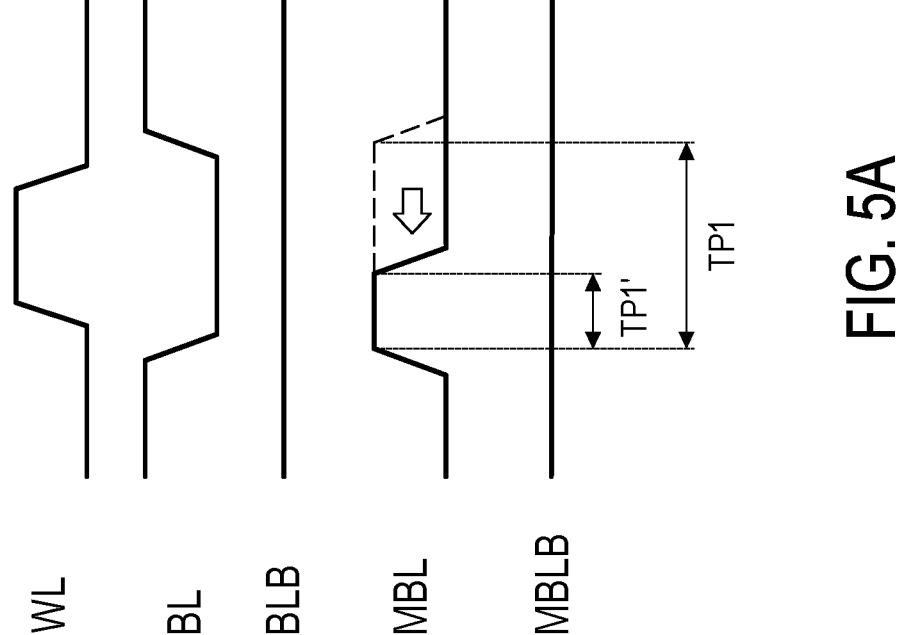
FIG. 5A and FIG. 5B are timing diagrams respectively illustrating waveform of a write operation for a selected one of the memory devices, according to some embodiments of the present disclosure.
Figure 5B:
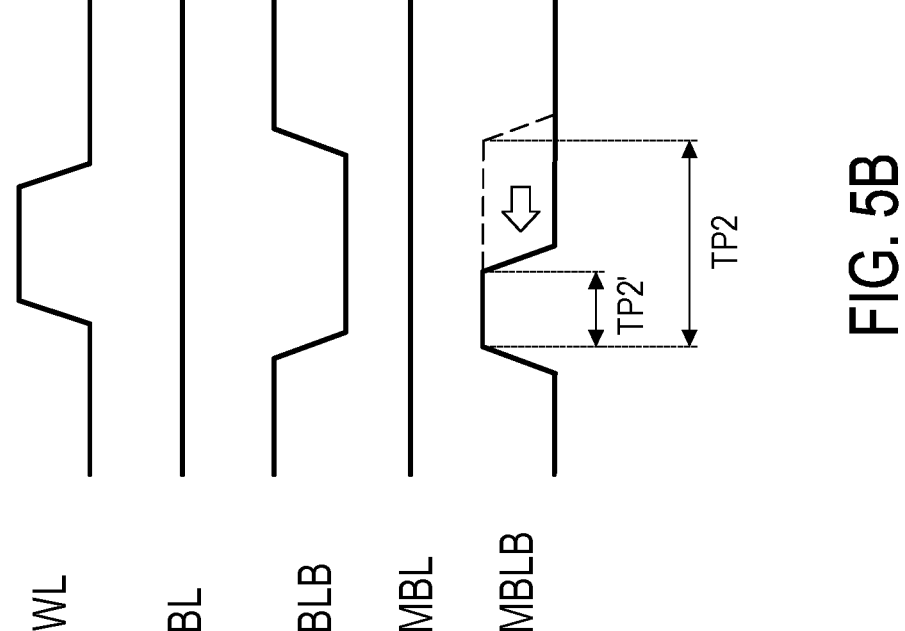

FIG. 5A and FIG. 5B are timing diagrams respectively illustrating waveform of a write operation for a selected one of the memory devices 10, according to some embodiments of the present disclosure.

As similar to the write operation described with reference to FIG. 2B, the write operation shown in FIG. 5A is performed to write the logic low data "0" to the storage node Q keeping the logic high data "1". As a difference, the mask bit line MBL is pulled (e.g., pulled up) to switch off the selection transistor S1 at beginning of the write operation, but released (e.g., pulled down) before end of the write operation. That is, a time period TP1' in which the mask bit line MBL being pulled (e.g., pulled up) is shorter than the entire time period TP1 of the write operation. Since the access transistor 110 may only compete with the pull up transistor PU1 at an early stage of the write operation, the mask bit line MBL does not have to be pulled (e.g., pulled up) through the write operation for keeping the pull up transistor PU1 decoupled from the storage node Q. Instead, the mask bit line MBL can be released (i.e., pulled down) right after the logic low data "0" is written to the storage node Q by the access transistor 110. By shortening the time in which the mask bit line MBL is pulled (e.g., pull up) to switch off the selection transistor S1 in the selected memory device 10, floating time of the storage node Q in each of the half-selected memory devices 10 in the same column can be reduced.

As similar to the write operation described with reference to FIG. 2D, the write operation shown in FIG. 5B is performed to write the logic low data "0" to the storage node QB keeping the logic high data "1". As a difference, the mask bit line MBLB is pulled (e.g., pulled up) to switch off the selection transistor S2 at beginning of the write operation, but released (e.g., pulled down) before end of the write operation. That is, a time period TP2' in which the mask bit line MBLB being pulled (e.g., pulled up) is shorter than the entire time period TP2 of the write operation. Since the access transistor 112 may only compete with the pull up transistor PU2 at an early stage of the write operation, the mask bit line MBLB does not have to be pulled (e.g., pulled up) through the write operation for keeping the pull up transistor PU2 decoupled from the storage node QB. Instead, the mask bit line MBLB can be released (i.e., pulled down) right after the logic low data "0" is written to the storage node QB by the access transistor 112. By shortening the time in which the mask bit line MBLB is pulled (e.g., pull up) to switch off the selection transistor S2 in the selected memory device 10, floating time of the storage node QB in each of the half-selected memory devices 10 in the same column can be reduced.

In the embodiments described so far, the selection transistors S1, S2 are placed to control coupling between the storage nodes Q, QB and the pull up transistors PU1, PU2. In alternative embodiments, selection transistors are disposed to control coupling between the storage nodes Q, QB and the pull down transistors PD1, PD2.

Figure 6:
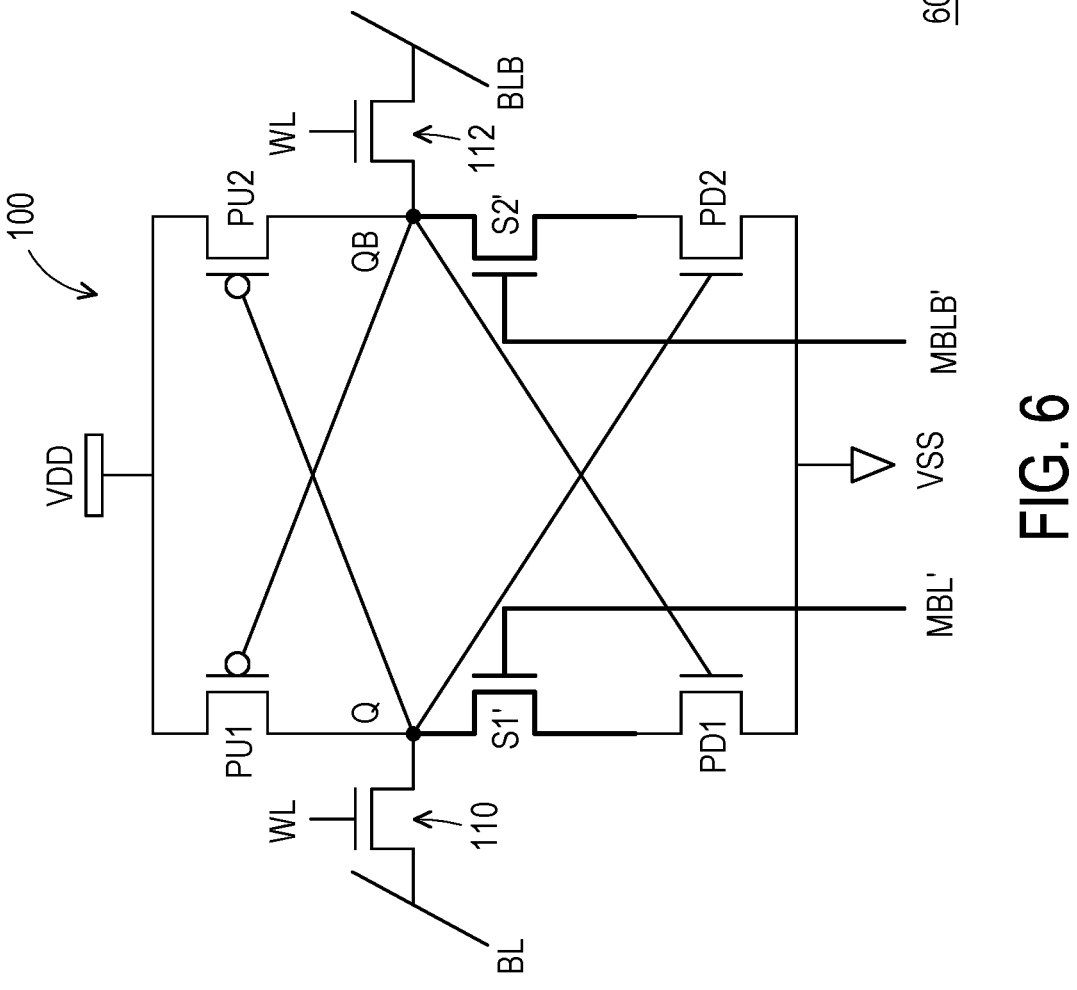
FIG. 6 is a circuit diagram illustrating a memory device, according to some other embodiments of the present disclosure.

FIG. 6 is a circuit diagram illustrating a memory device 60, according to some embodiments of the present disclosure.

The memory device 60 is similar to the memory device 10 described above, except for a few differences. In the memory device 60, a selection transistor S1' is disposed to control coupling between the storage node Q and the pull down transistor PD1, and a selection transistor S2' is disposed to control coupling between the storage node QB and the pull down transistor PD2. On the other hand, the storage node Q may be directly coupled to the pull up transistor PU1 without any selection transistor in between. Similarly, the storage node QB may be directly coupled to the pull up transistor PU2 without any selection transistor in between.

Switching of the selection transistor S1' is controlled by a mask bit line MBL', and switching of the selection transistor S2' is controlled by a mask bit line MBLB'. In some embodiments, the selection transistors S1', S2' are implemented by n-type transistors. In these embodiments, the storage node Q can be coupled to the pull down transistor PD1 when the mask bit line MBL' is kept at a high voltage (e.g., the power supply voltage VDD), and decoupled from the pull down transistor PD1 when the mask bit line MBL' is pulled down to a low voltage (e.g., the reference voltage VSS). Similarly, the storage node QB can be coupled to the pull down transistor PD2 when the mask bit line MBLB' is kept at a high voltage (e.g., the power supply voltage VDD), and decoupled from the pull down transistor PD2 when the mask bit line MBLB' is pulled down to a low voltage (e.g., the reference voltage VSS).

As similar to the write scheme for the memory device 10, one of the storage nodes Q, QB in the memory device 60 is decoupled from the corresponding pull down transistor PD1/PD2 during a write operation.

Figure 7A:
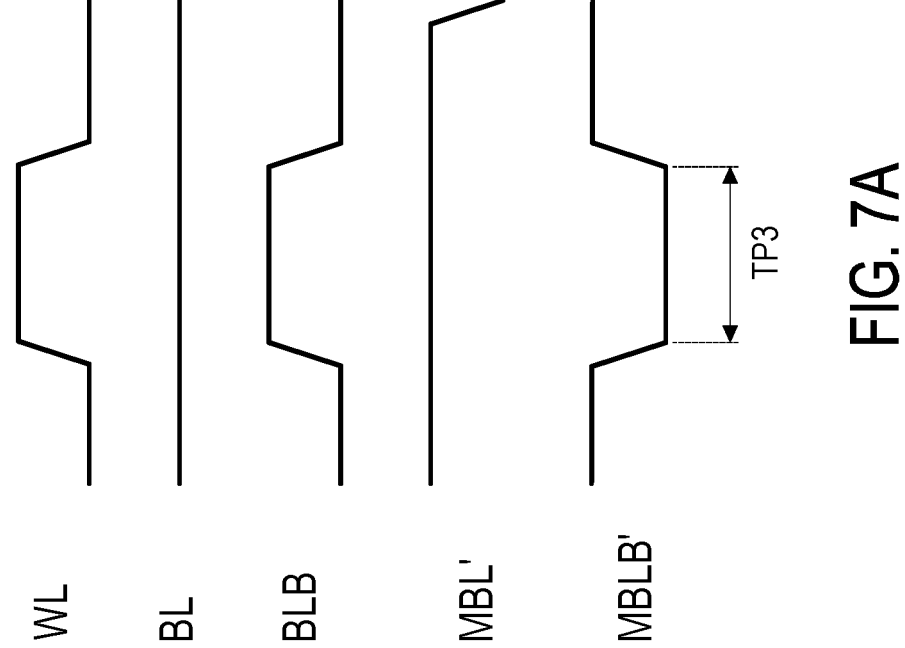
FIG. 7A and FIG. 7B are timing diagrams respectively illustrating waveform of a write operation for the memory device shown in FIG. 6, according to some embodiments of the present disclosure.
Figure 7B:
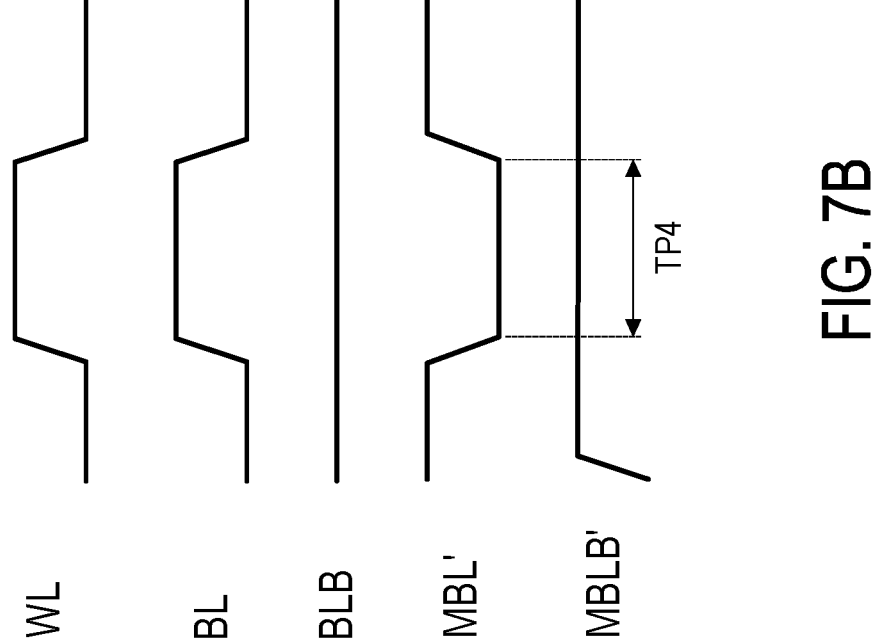

FIG. 7A and FIG. 7B are timing diagrams respectively illustrating waveform of a write operation for the memory device 60, according to some embodiments of the present disclosure.

In the write operation shown in FIG. 7A, a logic high data "1" is instructed to be written to the storage node QB keeping a logic low data "0". As keeping the logic low data "0", the storage node QB is coupled to the reference voltage VSS through the selection transistor S2' and the pull down transistor PD2. That is, initially, the mask bit line MBLB' controlling switch of the selection transistor S2' is asserted (e.g., kept at a high voltage).

As the write operation for writing the logic high data "1" to the storage node QB (or writing the logic low data "0" to the storage node Q) begins, the bit line BLB is pulled up to the logic high voltage indicating the logic high data "1", and the word line WL is asserted (i.e., pulled up). Accordingly, the storage node QB is coupled to the bit line BLB through the access transistor 112, and can be pulled up. In an early stage of the write operation, the pull down transistor PD2 may still be conducting (as the gate terminal of the n-type pull down transistor PD2 is coupled to the storage node Q storing the logic high data "1"). To prevent the pull down transistor PD2 from pulling the storage node QB against the access transistor 112, the pull down transistor PD2 is forced to be decoupled from the storage node QB by turning off the selection transistor S2' during the write operation. When the selection transistor S2' is implemented by an n-type transistor, the mask bit line MBLB' is pulled down during the write operation, for switching off the selection transistor S2'. As shown in FIG. 7A, according to some embodiments, the mask bit line MBLB' is pulled (e.g., pulled down) in an entire time period TP3 of the write operation, such that a conduction channel of the selection transistor S2' is cut off during the entire time period TP3 of the write operation. Since the pull down transistor PD2 is decoupled from the storage node QB, the access transistor 112 can perform the writing without competing with the pull down transistor PD2. In other words, the access transistor 112 is not required to have a very strong driving ability for ensuring successful write. In alternative embodiments as similar to the embodiments described with reference to FIG. 5A and FIG. 5B, the mask bit line MBLB' is released (e.g., pulled back up) before end of the write operation, and the time in which the mask bit line MBLB' is pulled (e.g., pulled down) is shorter than the entire time period TP3 of the write operation.

Meanwhile, the bit line BL is coupled to a logic low voltage (e.g., the reference voltage VSS) indicating a logic low data "0". As the access transistor 110 is turned on by the asserted word line WL, the storage node Q can be pulled down through the access transistor 110. Also, as the storage node QB is pulled up to the logic high voltage indicating the logic high data "1", the pull down transistor PD1 with gate terminal coupled to the storage node QB is turned on, while the pull up transistor PU1 with gate terminal coupled to the storage node QB is switched off. By keeping the mask bit line MBL' asserted, the selection transistor S1' is turned on as well. Accordingly, pulling down the storage node Q can also be performed through the selection transistor S1' and the pull down transistor PD1. In those embodiments where the selection transistor S1' is an n-type transistor, the mask bit line MBL' is remained at a logic high voltage during the write operation, for ensuring that the selection transistor S1' is kept on.

As the storage node QB is pulled up and the storage node Q is pulled down, the write operation is completed. According to some embodiments, after the write operation, the selection transistor S2' is switched back on, and the selection transistor S1' is remained conducting. In this way, the data stored at the storage nodes Q, QB can be kept as a result of the cross coupling of the inverters in the latch circuit 100. In those embodiments where the selection transistors S1', S2' are n-type transistors, the mask bit line MBLB' is pulled up after the time period TP3, whereas the mask bit line MBL' is remained at the logic high voltage through the write operation.

In the write operation shown in FIG. 7B, a logic high data "1" is instructed to be written to the storage node Q keeping a logic low data "0". As keeping the logic low data "0", the storage node Q is coupled to the reference voltage VSS through the selection transistor S1' and the pull down transistor PD1. That is, initially, the mask bit line MBL' controlling switch of the selection transistor S1' is asserted (e.g., kept at a high voltage).

As the write operation for writing the logic high data "1" to the storage node Q begins, the bit line BL is pulled up to the logic high voltage indicating the logic high data "1", and the word line WL is asserted (i.e., pulled up). Accordingly, the storage node Q is coupled to the bit line BL through the access transistor 110, and can be pulled up. In an early stage of the write operation, the pull down transistor PD1 may still be conducting (as the gate terminal of the n-type pull down transistor PD1 is coupled to the storage node QB storing the logic high data "1"). To prevent the pull down transistor PD1 from pulling the storage node Q against the access transistor 110, the pull down transistor PD1 is forced to be decoupled from the storage node Q by turning off the selection transistor S1' during the write operation. When the selection transistor S1' is implemented by an n-type transistor, the mask bit line MBL' is pulled down during the write operation, for switching off the selection transistor S1'. As shown in FIG. 7B, according to some embodiments, the mask bit line MBL' is pulled (e.g., pulled down) in an entire time period TP4 of the write operation, such that a conduction channel of the selection transistor S1' is cut off during the entire time period TP4 of the write operation. Since the pull down transistor PD1 is decoupled from the storage node Q, the access transistor 110 can perform the writing without competing with the pull down transistor PD1. In other words, the access transistor 110 is not required to have a very strong driving ability for ensuring successful write. In alternative embodiments as similar to the embodiments described with reference to FIG. 5A and FIG. 5B, the mask bit line MBL' is released (e.g., pulled back up) before end of the write operation, and the time in which the mask bit line MBL' is pulled (e.g., pulled down) is shorter than the entire time period TP4 of the write operation.

Meanwhile, the bit line BLB is coupled to a logic low voltage (e.g., the reference voltage VSS) indicating a logic low data "0". As the access transistor 112 is turned on by the asserted word line WL, the storage node QB can be pulled down through the access transistor 112. Also, as the storage node Q is pulled up to the logic high voltage indicating the logic high data "1", the pull down transistor PD2 with gate terminal coupled to the storage node Q is turned on, while the pull up transistor PU2 with gate terminal coupled to the storage node Q is switched off. By keeping the mask bit line MBLB' asserted, the selection transistor S2' is turned on as well. Accordingly, pulling down the storage node QB can also be performed through the selection transistor S2' and the pull down transistor PD2. In those embodiments where the selection transistor S2' is an n-type transistor, the mask bit line MBLB' is remained at a logic high voltage during the write operation, for ensuring that the selection transistor S2' is kept on.

As the storage node Q is pulled up and the storage node QB is pulled down, the write operation is completed. According to some embodiments, after the write operation, the selection transistor S1' is switched back on, and the selection transistor S2' is remained conducting. In this way, the data stored at the storage nodes Q, QB can be kept as a result of the cross coupling of the inverters in the latch circuit 100. In those embodiments where the selection transistors S1', S2' are n-type transistors, the mask bit line MBL' is pulled up after the time period TP4, whereas the mask bit line MBLB' is remained at the logic high voltage through the write operation.

It should be appreciated that a read scheme described with reference to FIG. 1 can be used for the memory device 60. In addition, during a standby mode of the memory device 60, the mask bit lines MBL', MBLB' can be operated to temporarily decouple the storage nodes Q, QB from the pull down transistors PD1, PD2 for reducing power consumption, as similar to the standby mode for the memory device 10. Further, those skilled in the art can design a layout of the memory device 60 according to adopted technology node, the present disclosure is not limited thereto.

As above, the storage nodes Q, QB can be selectively coupled to the pull up transistors PU1, PU2 through the selection transistors S1, S2, or can be selectively coupled to the pull down transistors PD1, PD2 through the selection transistors S1', S2'. By switching off the selection transistor S1/S2 or the selection transistor S1'/S2' during each write operation, the access transistor 110/112 would not have to compete with the pull up transistor PU1/PU2 or the pull down transistor PD1/PD2 in each write operation, thus successful write can be ensured without enhancing driving ability of the access transistors 110, 112. That is, width and/or width/length ratio of the access transistors 110, 112 can be reduced without compromising write operations. Further, the scaling of the access transistors 110, 112 is beneficial for ensuring read stability. Moreover, by switching off the selection transistors S1, S2 or the selection transistors S1', S2' during standby mode, power consumption can be effectively reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device, comprising:
a latch circuit, comprising a first inverter and a second inverter cross-coupled with each other, wherein a first pull up transistor and a first pull down transistor of the first inverter are coupled through a first selection transistor, and a second pull up transistor and a second pull down transistor of the second inverter are coupled through a second selection transistor;
a first access transistor, coupled to a first storage node of the latch circuit; and
a second access transistor, coupled to a second storage node of the latch circuit, wherein
the first access transistor is coupled to a first bit line, the second access transistor is coupled to a second bit line, a gate terminal of the first selection transistor is controlled by a first mask bit line, and a gate terminal of the second selection transistor is controlled by a second mask bit line.

2. The memory device according to claim 1, wherein the first storage node is selectively coupled to the first pull up transistor through the first selection transistor, and the second storage node is selectively coupled to the second pull up transistor through the second selection transistor.

3. The memory device according to claim 2, wherein the first pull up transistor, the first selection transistor, the second pull up transistor and the second selection transistor are implemented by p-type transistors.

4. The memory device according to claim 1, wherein the first storage node is selectively coupled to the first pull down transistor through the first selection transistor, and the second storage node is selectively coupled to the second pull down transistor through the second selection transistor.

5. The memory device according to claim 4, wherein the first pull down transistor, the first selection transistor, the second pull down transistor and the second selection transistor are implemented by n-type transistors.

6. The memory device according to claim 1, wherein one of the first and second selection transistors is configured to be switched off during a write operation.

7. The memory device according to claim 6, wherein the one of the first and second selection transistors is configured to remain off until end of the write operation.

8. The memory device according to claim 6, wherein the one of the first and second selection transistors is configured to be switched on before end of the write operation.

9. The memory device according to claim 8, wherein the one of the first and second selection transistors is configured to be kept off until data stored at one of the first and second storage nodes is flipped during the write operation.

10. The memory device according to claim 1, wherein the first and second selection transistors are configured to be temporarily switched off in a standby mode of the memory device.

11. The memory device according to claim 1, wherein
the first mask bit line is pulled in an entire time period of a write operation, and
the second mask bit line is remained at a logic low voltage during the write operation.

12. A memory device, comprising:
a latch circuit, comprising a first inverter with a first pull up transistor, a first pull down transistor and a first selection transistor connected in between, and comprising a second inverter with a second pull up transistor, a second pull down transistor and a second selection transistor connected in between;
a first access transistor, coupled to a first common source/drain terminal shared by the first selection transistor and one of the first pull up transistor and the first pull down transistor; and
a second access transistor, coupled to a second common source/drain terminal shared by the second selection transistor and one of the second pull up transistor and the second pull down transistor, wherein
the first access transistor is coupled to a first bit line, the second access transistor is coupled to a second bit line, a gate terminal of the first selection transistor is controlled by a first mask bit line, and a gate terminal of the second selection transistor is controlled by a second mask bit line.

13. The memory device according to claim 12, wherein a width/length ratio of the first and second access transistors is less than a width/length ratio of the first and second pull up transistors.

14. The memory device according to claim 12, wherein a beta ratio defined as a ratio of a width/length ratio of the first and second pull down transistors over a width/length ratio of the first and second access transistors is no less than 1.6.

15. The memory device according to claim 12, wherein a width/length ratio of first and second pull down transistors in the latch circuit is less than a width/length ratio of the first and second pull up transistors.

16. The memory device according to claim 12, wherein the first and second selection transistors are implemented by p-type transistors, the first access transistor is coupled to the first common source/drain terminal shared by the first selection transistor and the first pull down transistor, and the second access transistor is coupled to the second common source/drain terminal shared by the second selection transistor and the second pull down transistor.

17. The memory device according to claim 16, wherein the first pull up transistor and the first selection transistor are formed along a first active region, and the second pull up transistor and the second selection transistor are formed along a second active region.

18. The memory device according to claim 12, wherein the first and second selection transistors are implemented by n-type transistors, the first access transistor is coupled to the first common source/drain terminal shared by the first selection transistor and the first pull up transistor, and the second access transistor is coupled to the second common source/drain terminal shared by the second selection transistor and the second pull up transistor.

* * * * *